(12) United States Patent  
Yang et al.

(10) Patent No.: US 8,409,986 B2  
(45) Date of Patent: Apr. 2, 2013

(54) METHOD FOR IMPROVING WITHIN DIE UNIFORMITY OF METAL PLUG CHEMICAL MECHANICAL PLANARIZATION PROCESS IN GATE LAST ROUTE

(75) Inventors: Tao Yang, Beijing (CN); Chao Zhao, Kessel-Lo (BE); Junfong Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/377,889

(22) PCT Filed: Apr. 20, 2011

(86) PCT No.: PCT/CN2011/000692  
§ 371 (c)(1),  
(2), (4) Date: Dec. 13, 2011

(87) PCT Pub. No.: WO2012/094782  
PCT Pub. Date: Jul. 19, 2012

(65) Prior Publication Data  
US 2012/0178255 A1    Jul. 12, 2012

(30) Foreign Application Priority Data  
Jan. 11, 2011    (CN) .......................... 2011 1 0005058

(51) Int. Cl.  
*H01L 21/768*    (2006.01)

(52) U.S. Cl. ........ 438/653; 438/626; 438/631; 438/672; 257/E21.584

(58) Field of Classification Search ................... 438/653, 438/672; 257/E21.584  
See application file for complete search history.

(56) References Cited

U.S. PATENT DOCUMENTS

| | | | |
|---|---|---|---|
| 4,662,064 A * | 5/1987 | Hsu et al. ....................... | 438/631 |
| 5,015,602 A * | 5/1991 | Van Der Plas et al. ........ | 438/424 |
| 6,274,485 B1 | 8/2001 | Chen | |
| 6,376,361 B1 * | 4/2002 | Chooi et al. ................... | 438/631 |
| 6,709,973 B1 * | 3/2004 | Sakamoto ...................... | 438/633 |
| 6,884,729 B2 * | 4/2005 | Lee et al. ....................... | 438/704 |
| 2003/0003718 A1 | 1/2003 | Park | |
| 2005/0196965 A1 | 9/2005 | Kim | |
| 2008/0081478 A1 * | 4/2008 | Huang et al. ................... | 438/697 |

OTHER PUBLICATIONS

International Search Report PCT/CN2011/000692.

* cited by examiner

*Primary Examiner* — Angel Roman  
(74) *Attorney, Agent, or Firm* — Troutman Sanders LLP

(57) ABSTRACT

A method for improving the within die uniformity of the metal plug CMP process in the gate last route is provided. Before performing the CMP process for forming the metal plug, a metal etching process is applied, so that the step height between the metal layers in the contact hole area and the non-contact hole area is greatly reduced. Therefore, the relatively small step height will exert a significantly less effect on the following CMP process, so that the step height will be limitedly transferred to the top of metal plug after finishing CMP process. In this way, the recess on top of the metal plug is largely reduced, so that a flat top of the metal plug is obtained, and within die uniformity and electrical properties the device are improved.

10 Claims, 3 Drawing Sheets

METHOD FOR IMPROVING WITHIN DIE UNIFORMITY OF METAL PLUG CHEMICAL MECHANICAL PLANARIZATION PROCESS IN GATE LAST ROUTE

This application is a Section 371 National Stage Application of International Application No. PCT/CN2011/000692, filed on Apr. 20, 2011, which claims priority to CN201110005058.1 filed on Jan. 11, 2011 entitled "Method for improving within die uniformity of metal plug chemical mechanical planarization process in gate last route", the entire contents of which are incorporated herein by reference in their entirety.

FIELD OF THE INVENTION

The present invention relates to a process method for fabricating a semiconductor device, and more particularly, to a method for improving within die uniformity of metal plug chemical mechanical planarization process in gate last route.

BACKGROUND OF THE INVENTION

The successful application of the high k/metal gate route in technology nodes of 45 nm makes it a key modular engineering, which is essential for technology nodes below 30 nm. Nowadays, only the Intel Corporation, which persisted in gate last route succeeding in the mass-production at the 45 nm and 32 nm technology nodes. In recent years, the industry giants like Samsung, TMSC, Infineon etc, which follow closely the IBM industrial alliance, also change their R&D focus from gate first to the gate last route.

For gate last route, it is believed in the industry that chemical mechanical planarization (CMP) process development is one of the most challenging. In gate last route, two CMP processes are required in the first generation of high k/metal gate technology, namely, the poly-open planarization CMP (POP CMP) for opening the top of the polycrystalline gate and the Al metal gate CMP. In the second generation of high k/metal gate technology, in addition to the above two CMP processes, a W—Al buffer layer CMP process is further required, and an ideal schematic view for the structure after planarization is shown in FIG. 1. According to the CMP process, after an Al gate 10 is formed by the metal gate CMP, contact holes are etched through over the source/drain regions, metal tungsten (W) is filled in the contact holes by CVD process, and the surplus W is removed by CMP process to form W plugs 11. This W—Al buffer CMP process poses several big challenges for the CMP technique, for example, the removal rate selectivity among the metal W, Al, and the oxide, the electrochemical corrosion between W and Al, and the Al metal gate recess and W plug after CMP process.

Below 45 nm technology node, the conventional CMP faces one great challenge is that how to improve the within die uniformity. The within die uniformity is a critical planarization characteristic for CMP process. After finishing contact holes etch and contact silicide, barrier layer Ti/TiN and metal W is respectively deposited in the contact holes by PVD and CVD process. The W depth of the contact holes is usually in the range of 1000-1500 Å. After deposition of W layer 12, the step height h between the top of contact hole area and non-contact hole area may be 1000-3000 Å or even larger due to very large device density, as shown in FIG. 2. If using conventional W CMP process, the step height will be transferred to the end of CMP process, so the recess 13 appear on top of W plugs, as shown in FIG. 3. The W plugs recess is significantly adverse for next step of connecting Cu lines, which may even result in a contact open between W plugs and Cu lines. In order to solve this problem, a step of oxide CMP buffer is needed to remove some oxide after finishing conventional W CMP, so that W plugs will protrude to some extent. As can be seen in FIG. 1, in the second generation of high k/metal gate technology, W plug structure differs from the process structure before 45 nm, and the relatively thin oxide separating layer results in a very small adjusting window for the oxide buffer CMP process. In addition, although W plug may protrude by means of the oxide buffer CMP, the Al metal gate electrodes will also protrude, so that leakage current between metal gates or between metal gates and W plugs may be greatly increased, which degrades electrical properties of the device, and even results a low yield.

Therefore, an efficient metal plug CMP is necessary for the second generation of high k/metal gate technology in the gate last route, which can meet the requirements of within die uniformity and device electrical performances.

SUMMARY OF THE INVENTION

The present invention provides a method of combining the metal etching with the conventional metal CMP, which improves within die uniformity of the metal plug CMP for the second generation of high k/metal gate technology in the gate last route.

The present invention provides a method for improving within die uniformity of the metal plug CMP process in the gate last route, comprising the steps of:
  providing a substrate, a metal gate on the substrate, and a contact hole area between adjacent metal gates;
  depositing a metal layer on the substrate, the metal should completely fill the contact hole, a step height will exist between the metal layer top of contact hole area and non-contact hole area, and the absolute value of the step height is denoted as H;
  planarizing the metal layer with a CMP process to remove the plus metal layer, and forming metal plugs with a flat top
  wherein before the CMP process, the method comprises the steps of:
  after depositing the metal layer, coating a photo resist layer on the substrate, and then exposure with a non-contact hole pattern photo mask. After photo resist developing, only the photo resist covering contact hole area is kept, and metal layer of non-contact hole area is exposed;
  dry etching the exposed metal layer of non-contact hole area, the etching depth of should be smaller than or equal to H;
  after finish dry etching process, the step height H will is reduced;
  removing the photo resist remain on the contact hole area using photo resist stripping process.

In the method of the present invention, the material of the metal layer comprises W.

In the method of the present invention, before depositing the W metal layer, a barrier layer covering the sidewall and bottom of the contact hole is deposited by PVD method, and the barrier layer is a stack of Ti/TiN;

In the method of the present invention, the primary etching gas in the etching process mainly comprises a F-based gas, which includes, but not limited to, $SF_6$ or $NF_3$;

In the method of the present invention, the auxiliary additive gas in the etching process includes, but not limited to, one or more of $N_2$, $BCl_3$, $CHF_3$, Ar;

In the method of the present invention, the CMP process is a chemical planarization process based on metal W;

In the method of the present invention, the polishing slurry in the CMP process comprises an acidic or alkaline $Al_2O_3$-based slurry, or an acidic or alkaline $SiO_2$-based slurry;

In the method of the present invention, the polishing slurry in the CMP process comprises an acidic or alkaline grinding-particle-free slurry;

In the method of the present invention, the polishing pad in the CMP process comprises a hard polishing pad or a soft polishing pad.

The advantage of the present invention lies in that before the metal plug CMP process, a metal etching process is applied, so that the metal step height between contact hole area and non-contact hole area is greatly reduced. Therefore, the relatively small step height will exert a significantly less effect on the following CMP process, so that the step height will be limitedly transferred to the top of metal plug after finishing CMP process. In this way, the recess of the metal plug is largely reduced, so that a flat top of the metal plug is obtained, and within die uniformity and electrical properties the device are improved.

DESCRIPTION OF EMBODIMENTS

The features of the technical solutions according to the present invention and the technical effects will be described hereinafter in details with reference to the accompanying drawings and the exemplary embodiment(s).

Figure 1:
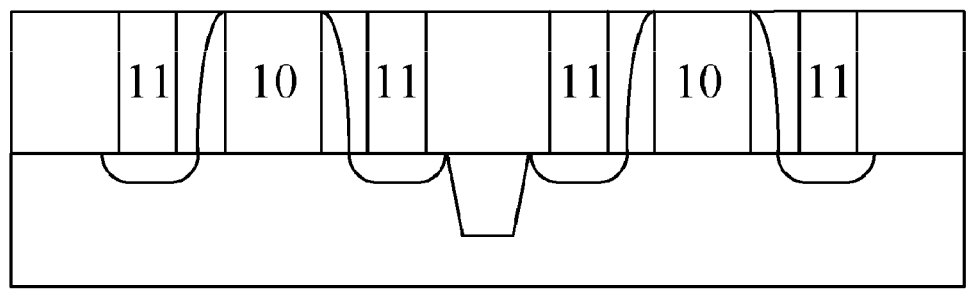
FIG. 1 an ideal device structure after the W-Al buffer CMP process.
Figure 2:
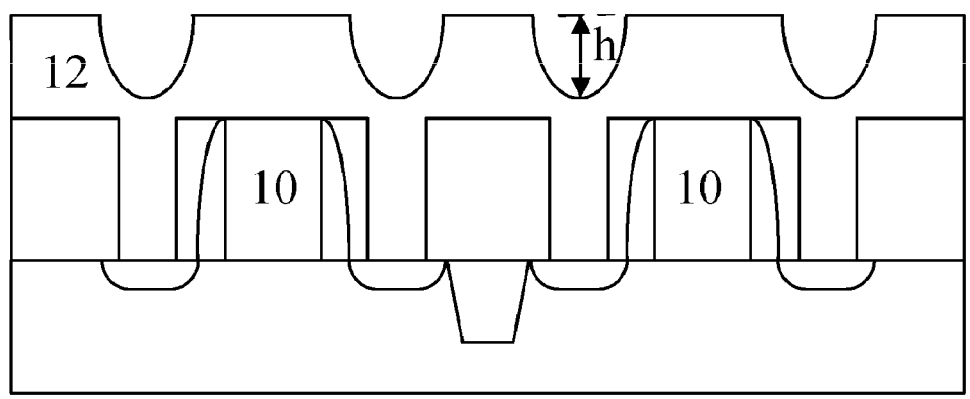
FIG. 2 the step height of the metal layer before a CMP process.
Figure 3:
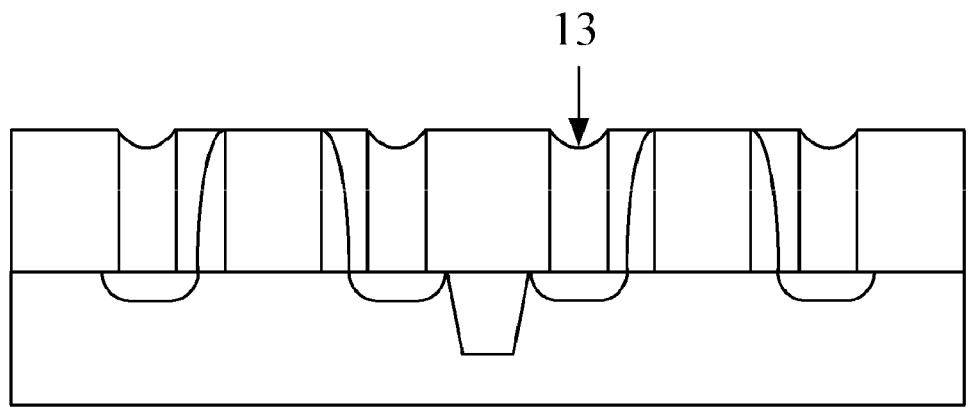
FIG. 3 the metal plug recess after a conventional metal CMP
Figure 4:
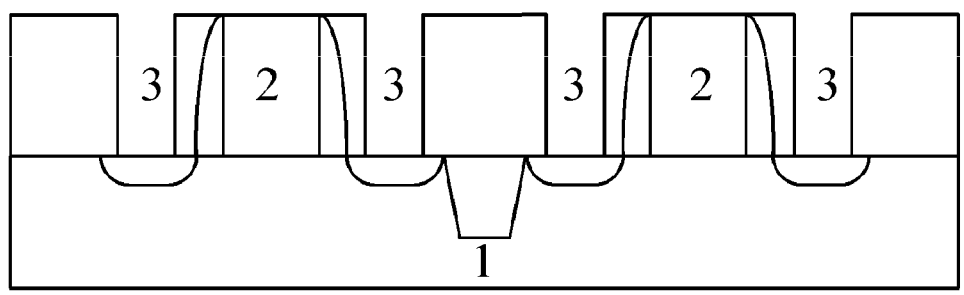
FIG. 4 forming contact hole on the substrate.

Firstly, as shown in FIG. 4, in the gate last route, a substrate 1 is provided, on which metal gates 2 and one or more contact holes 3 between the adjacent metal gates 2 are provided. The substrate 1 can be common substrates in the semiconductor device, such as Si, GaAs, etc.; the material for the metal gate 2 includes, but not limited to, Al, and other metals suitable for fabricating the gate may also be used. In general, the height of the metal gate 2 is 1000~1500 Å.

Figure 5:
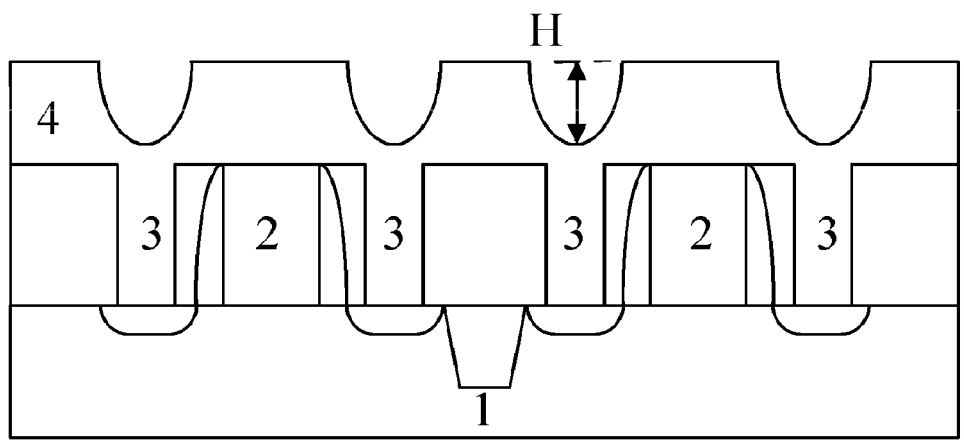
FIG. 5 after depositing a metal layer on the substrate.

A metal layer 4 is deposited on the surface of the substrate 1, as shown in FIG. 5. The process like CVD, PVD, ALD, etc. can be applied for depositing the metal layer 4.

The material for the metal layer 4 includes, but not limited to, W, and other materials suitable for fabricating the plug, like Al, Al—Ti alloy, Ti—N—Al alloy, Cu, can also be used. If the material for the metal layer 4 is W, optionally, prior to the process of depositing the metal layer 4, a barrier layer is formed in the contact hole 3. The barrier layer is a stack of Ti/TiN if metal plug is W. Before barrier layer deposition, contact silicide process should be finished using Ni or Ni/Pt. The metal layer 4 is deposited to a thickness that it can at least completely fill the contact hole area 3. Due to the influence of the device structure and the deposition process, the upper surface of the metal layer 4 in the contact hole area 3 is the lowest position in the whole metal layer 4, while the upper surface of the metal layer 4 in the non-contact hole area, is the highest position in the whole metal layer 4. As a result, there is a step height between the upper surface of the metal layer 4 in the contact hole area 3 and non-contact hole area 4. The absolute value of the step height is denoted as H. The value of H is generally not less than the height of the metal gate 2, and normally ranges between 1000 Å-3000 Å.

Figure 6:
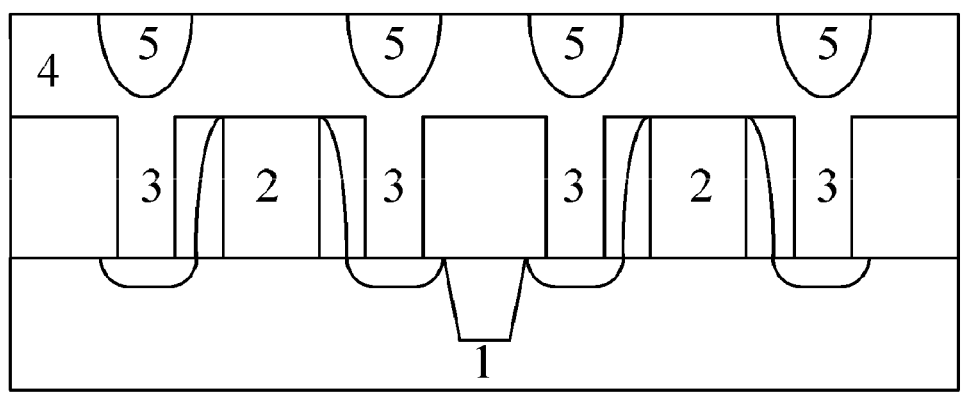
FIG. 6 forming a photo resist pattern.

After metal layer 4 deposition is completed, the whole substrate 1 is coated with the photo resist. By selecting a suitable photo mask, a photo resist pattern 5 is formed by exposure and development. The photo resist pattern 5 exposes the metal layer 4 in the non-contact hole area, but remain photo resist in the contact hole area 3, as shown in FIG. 6.

Figure 7:
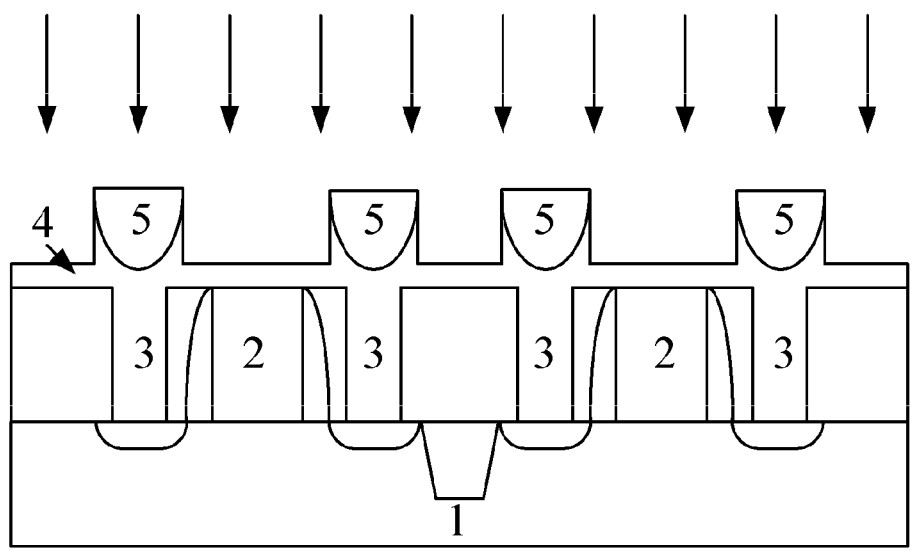
FIG. 7 performing metal dry etching.
Figure 8:
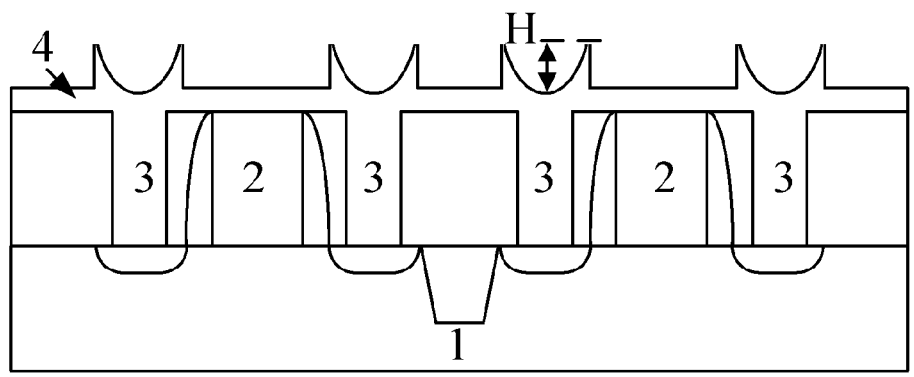
FIG. 8 after photo resist stripping.

The metal layer 4 exposed in the non-contact hole area is etched by dry etching process. The conditions and time for dry etching the metal are suitably selected according to the value of step height H, and the etching depth is smaller than or equal to H, as shown in FIG. 7, which indicates the direction of dry etching process that reducing metal layer 4 by arrows. An anisotropic dry etching process is used as the etching process. According to the material of the metal layer 3, in the method of the present invention, the primary etching gas in the etching process mainly comprises a F-based gas, and includes, but not limited to, $SF_6$ or $NF_3$. In the method of the present invention, the auxiliary additive gas in the etching process includes, but not limited to, one or more of $N_2$, $BCl_3$, $CHF_3$, Ar. Then, with a photo resist stripping process, as shown in FIG. 8, the photo resist pattern 5 is removed by a wet or dry etching method, and the whole substrate 1 is dried.

In order to ensure the performance of the metal layer 4 intact, the photo resist stripping process conditions should not have any adverse effect on the metal layer 4. After finishing this etching process, the step height H between the upper surface of the metal layer 4 in the contact hole area 3 and non-contact hole area 4 is reduced.

Figure 9:
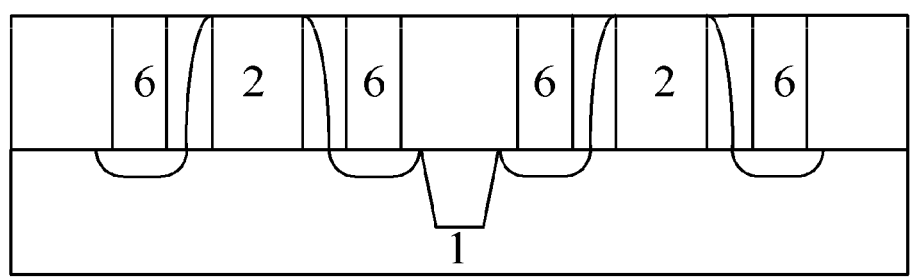
FIG. 9 a flat top of a metal plug after metal CMP

Subsequently, with a CMP process, the metal layer 4 is planarized to completely remove the redundant metal layer, so that only metal in contact hole is remained, and meanwhile the metal gate 2 is exposed, thereby metal plugs 6 with a flat top are obtained, as shown in FIG. 9. According to the material of the metal layer 4, the CMP process can be based on metal W. At the same time, various polishing slurries and polishing pads can be applied in the CMP process. For example, the polishing slurries may comprise an acidic or alkaline $SiO_2$-based slurry, an acidic or alkaline $Al_2O_3$-based slurry, an acidic or alkaline grinding-particle-free slurry, and the polishing pads may comprise a hard polishing pad or a soft polishing pad.

In the present invention, before the metal plug CMP process, a metal etching process is applied, so that the metal step height between contact hole area and non-contact hole area is greatly reduced. Therefore, the relatively small step height will exert a significantly less effect on the following CMP process, so that the step height will be limitedly transferred to the top of metal plug after finishing CMP process. In this way, the recess of the metal plug is largely reduced, so that a flat top of the metal plug will be obtained, and within die uniformity and electrical properties the device will be improved.

Although the present invention has been described with reference to the above exemplary embodiments, various reasonable modifications and equivalents to the technical solutions of the present invention can occur to those skilled in the art without departing from the scope of the invention. In addition, various possible modifications suitable for specific situation or material can be made in accordance with the teachings disclosed herein without departing from the scope of the present invention. Therefore, the present invention is not intended to be limited to the specific embodiments which are disclosed as the best embodiments for implementing the present invention, and the device structure and the fabricating method of the same disclosed herein should cover all embodiments which fall within the scope of the present invention.

The invention claimed is:

1. A method for improving within die uniformity of the metal plug CMP process in the gate last route, comprises:

providing a substrate, a metal gate on said substrate, and a contact hole area between the adjacent metal gates;

depositing a metal layer on said substrate, said metal layer can at least completely fill said contact hole area, a step height exists between the upper surface of said metal layer in said contact hole area and said non-contact hole area, and the absolute value of said difference in height is denoted as H;

planarizing said metal layer with a chemical mechanical planarization process to remove said redundant metal layer, so that said metal layer is only remained within said contact hole, and metal plugs with a flat top are formed;

characterized in that, before said chemical mechanical planarization process, the method comprises the steps of:

after depositing said metal layer, coating on said substrate a photo resist on which exposure with a photo mask is performed to form a photo resist pattern, wherein said photo resist pattern covers said metal layer of said contact hole area and exposes said metal layer of said non-contact hole area;

etching the exposed metal layer said non-contact hole area with dry etching process, the etching depth of said etching process being smaller than or equal to H;

after said etching process, the step height between the upper surface of said metal layer of said contact hole area and said non-contact hole area is reduced;

removing said photo resist pattern on said substrate with a photo resist stripping process.

2. The method according to claim 1, characterized in that, the material for said metal layer comprises W.

3. The method according to claim 2, characterized in that, before depositing said metal layer, the method further comprises a process of forming a barrier layer within said contact hole area.

4. The method according to claim 3, characterized in that, said barrier layer is a stack of Ti/TiN.

5. The method according to claim 1, characterized in that, the primary etching gas in said etching process mainly comprises a F-based gas, which includes, but not limited to, $SF_6$ or $NF_3$; the auxiliary additive gas in said etching process includes, but not limited to, one or more of $N_2$, $BCl_3$, $CHF_3$, Ar.

6. The method according to claim 1, characterized in that, the auxiliary additive gas in said etching process comprises $N_2$.

7. The method according to claim 1, characterized in that, said chemical mechanical planarization process is based on metal W.

8. The method according to claim 1, characterized in that, the polishing slurry in said chemical mechanical planarization process comprises an acidic or alkaline $Al_2O_3$-based slurry, or an acidic or alkaline $SiO_2$-based slurry.

9. The method according to claim 1, characterized in that, the polishing slurry in said chemical mechanical planarization process comprises an acidic or alkaline grinding-particle-free slurry.

10. The method according to claim 1, characterized in that, the polishing pad in said chemical mechanical planarization process comprises a hard polishing pad or a soft polishing pad.

* * * * *